(12) United States Patent
Wunderlich et al.

(10) Patent No.: US 9,000,433 B2
(45) Date of Patent: Apr. 7, 2015

(54) SPIN-POLARISED CHARGE-CARRIER DEVICE

(75) Inventors: Joerg Wunderlich, Cambridge (GB); Tomas Jungwirth, Praha (CZ); Andrew Irvine, Swavesey (GB); Jairo Sinova, College Station, TX (US)

(73) Assignee: Hitachi, Ltd., Tokyo (JP)

( * ) Notice: Subject to any disclaimer, the term of this patent is extended or adjusted under 35 U.S.C. 154(b) by 159 days.

(21) Appl. No.: 12/545,502

(22) Filed: Aug. 21, 2009

(65) Prior Publication Data

US 2010/0123133 A1    May 20, 2010

(30) Foreign Application Priority Data

Nov. 20, 2008   (EP) ..................................... 08169560

(51) Int. Cl.
| | | |
|---|---|---|
| H01L 23/58 | (2006.01) | |
| H01L 29/66 | (2006.01) | |
| G01J 4/04 | (2006.01) | |

(52) U.S. Cl.
CPC ............. H01L 29/66984 (2013.01); G01J 4/04 (2013.01)

(58) Field of Classification Search
USPC .............. 257/24, 14, E43.001, 421–427, 295, 257/295.272
See application file for complete search history.

(56) References Cited

U.S. PATENT DOCUMENTS

| | | | | |
|---|---|---|---|---|
| 5,291,034 A | * | 3/1994 | Allam et al. ..................... 257/17 |
| 5,652,445 A | * | 7/1997 | Johnson ......................... 257/295 |
| 6,178,275 B1 | * | 1/2001 | Nerses et al. .................... 385/14 |
| 6,297,987 B1 | * | 10/2001 | Johnson et al. ................ 365/158 |
| 6,381,171 B1 | * | 4/2002 | Inomata et al. ................ 365/173 |
| 6,963,091 B1 | * | 11/2005 | Vashchenko et al. ......... 257/213 |
| 6,987,484 B2 | * | 1/2006 | Von Klitzing et al. ........ 343/701 |
| 7,342,244 B2 | * | 3/2008 | Kaushal et al. .................. 257/24 |
| 7,528,428 B2 | * | 5/2009 | Sugahara et al. ............. 257/295 |
| 7,608,901 B2 | * | 10/2009 | Koo et al. ...................... 257/421 |
| 7,625,767 B2 | * | 12/2009 | Huang et al. ....................... 438/3 |
| 7,652,315 B2 | * | 1/2010 | Saito et al. .................... 257/295 |
| 7,800,097 B2 | * | 9/2010 | Hirose et al. ..................... 257/20 |
| 7,820,998 B2 | * | 10/2010 | Finkelstein et al. ............. 257/9 |
| 2001/0017388 A1 | * | 8/2001 | Ponomarev .................... 257/347 |
| 2001/0031547 A1 | * | 10/2001 | Ohno et al. .................... 438/602 |
| 2002/0114111 A1 | * | 8/2002 | Zhu ............................. 360/324.1 |

(Continued)

FOREIGN PATENT DOCUMENTS

| | | | |
|---|---|---|---|
| EP | 1 501 134 A1 | 1/2005 | |
| JP | WO2004079827 | * 9/2004 | ............. H01L 29/66 |

(Continued)

OTHER PUBLICATIONS

Effects of Spin—Orbit Coupling in Si and Ge, L. Liu, Physical Review, vol. 126, No. 4, May 15, 1962.*

(Continued)

*Primary Examiner* — Mohammad Islam
*Assistant Examiner* — Ankush Singal
(74) *Attorney, Agent, or Firm* — Baker Botts L.L.P.

(57) ABSTRACT

A device comprising a channel for charge carriers comprising non-ferromagnetic semiconducting in which charge carriers exhibit spin-orbit coupling, a region of semiconducting material of opposite conductivity type to the channel and configured so as to form a junction with the channel for injecting spin-polarized charge carriers into an end of the channel and at least one lead connected to the channel for measuring a transverse voltage across the channel.

25 Claims, 11 Drawing Sheets

(56) References Cited

U.S. PATENT DOCUMENTS

| | | | |
|---|---|---|---|
| 2002/0186584 A1* | 12/2002 | McDowell et al. | 365/171 |
| 2003/0075767 A1 | 4/2003 | Lannon, Jr. et al. | |
| 2003/0085413 A1* | 5/2003 | Wunderlich | 257/200 |
| 2004/0070038 A1* | 4/2004 | Tang et al. | 257/421 |
| 2004/0178460 A1* | 9/2004 | Lee et al. | 257/421 |
| 2004/0218248 A1* | 11/2004 | De Bougrenet De La Tocnaye et al. | 359/267 |
| 2005/0018467 A1* | 1/2005 | Naaman et al. | 365/145 |
| 2006/0118839 A1* | 6/2006 | Sugahara et al. | 257/295 |
| 2006/0138397 A1* | 6/2006 | Mattis | 257/15 |
| 2006/0215442 A1* | 9/2006 | Wunderlich et al. | 365/157 |
| 2007/0200156 A1* | 8/2007 | Wunderlich et al. | 257/296 |
| 2007/0210298 A1* | 9/2007 | Finkelstein et al. | 257/9 |
| 2007/0285848 A1* | 12/2007 | Williams et al. | 360/324.1 |
| 2008/0012004 A1* | 1/2008 | Huang et al. | 257/20 |
| 2008/0017843 A1* | 1/2008 | Kaushal et al. | 257/14 |
| 2008/0145952 A1* | 6/2008 | Parkin | 438/3 |
| 2008/0169492 A1* | 7/2008 | Koo et al. | 257/295 |
| 2008/0284424 A1* | 11/2008 | Van Roy | 324/252 |
| 2008/0303968 A1* | 12/2008 | Terada et al. | 349/46 |
| 2009/0200592 A1* | 8/2009 | Tsuchiaki et al. | 257/295 |

FOREIGN PATENT DOCUMENTS

| | | | | |
|---|---|---|---|---|
| JP | WO2005065037 | * | 7/2005 | H01L 29/02 |
| WO | WO 02/23638 A2 | | 3/2002 | |
| WO | WO 2005/109518 A1 | | 11/2005 | |
| WO | WO 2008/005719 A2 | | 1/2008 | |

OTHER PUBLICATIONS

S. D. Ganichev et al., "All-electric detection of the polarization state of terahertz laser radiation", Journal of Applied Physics, vol. 103, p. 114504 (Jun. 2008).

European Search Report, EP 08 16 9560, Dated Apr. 2, 2009.

* cited by examiner

SPIN-POLARISED CHARGE-CARRIER DEVICE

FIELD OF INVENTION

The present invention relates to a spin-polarised charge carrier device, particularly, but not exclusively, to a polarimeter.

BACKGROUND

A polarimeter can be used to measure changes in polarization caused by optical activity in materials, such as anisotropic crystalline solids and solutions containing chiral molecules.

A conventional polarimeter usually consists of a pair of linear polarizers and a photodetector, such as a photodiode. Light from a monochromatic source passes sequentially though a first polarizer having a fixed orientation, the sample and a second polarizer (or "analyzer"). The photodetector is used to detect the intensity of light reaching it from the analyzer.

Rotating the analyzer relative to the first polarizer varies the intensity of light reaching the photodetector. Thus, in the absence of an optically-active sample, the angle needed to minimize light intensity is 90°. However, in the presence of an optically-active sample, additional rotation, θ, is required.

The need for mechanically rotating the analyzer can be avoided by using an electrically-controllable wave plate (or "retarder") to introduce a controlled amount of optical rotation and, thus, compensate for optical activity of the sample. Notwithstanding this, it is generally desirable to simplify the polarimeter.

A polarimeter is described "All-electric detection of the polarization state of terahertz laser radiation", S. D. Ganichev, W. Weber, J. Kiermaier, S, N. Danilov, P. Olbrich, D. Schuh, W. Wegscheider, D. Bougeard, G. Abstreiter, and W. Prettl, journal of Applied Physics, volume 103, page 114504 (2008) in which longitudinal photogalvanic currents are determined by degree of linear polarization.

SUMMARY OF INVENTION

The present invention seeks to provide a spin-polarised charge carrier device which, for example, which can be used as an improved polarimeter.

According to a first aspect of certain embodiments of the present invention there is provided a device comprising a channel for charge carriers comprising non-ferromagnetic semiconducting material in which charge carriers exhibit spin-orbit coupling, a region of semiconducting material of opposite conductivity type to the channel and configured so as to form a junction with the channel for injecting spin-polarised charge carriers into an end of the channel and at least one lead connected to the channel for measuring a transverse voltage across the channel.

Thus, light can be used to generate spin-polarized charge carriers whose spin polarization is proportional to the degree of circular polarisation of the light and the charge carriers are transversely deflected depending on their local polarization in the channel.

The channel may comprise a potential well confining a two-dimensional charge-carrier gas, such as a two-dimensional electron gas. The potential well may be asymmetric. The semiconducting material may be a crystal having no inversion symmetry. The semiconducting material may comprise a III-V semiconductor, such as GaAs or AlGaAs.

The conductivity type of the region may be p-type and the conductivity type of the non-ferromagnetic semiconducting material may be n-type.

The device may further comprise a gate configured to apply an electric field to the channel. This can be used to tune the device by varying the Rashba spin-orbit coupling strength which can result from an asymmetric confining potential, e.g. by ensuring it is equal to the Dresselhaus spin-orbit coupling strength which can result from a lack of inversion symmetry of the material in the channel.

The leads may be arranged along one side or opposite sides of the channel. The at least one lead may comprise one or two leads spaced from the junction by a distance equal to about $N.(x_p/2)$, where N is a positive integer and $x_p=h/(4.m.\alpha)$, where h is Plank's constant, m is the effective mass of the charge carrier and α is Rashba coupling constant.

The at least one lead may comprise first and second leads connected to the channel between first and second ends and arranged on opposite sides of the channel for measuring a voltage difference across the channel.

The at least one lead may comprises third and fourth leads connected to the channel and arranged on opposite sides of the channel for measuring a voltage difference across the channel, said third and fourth leads spaced apart along the channel from the first and second leads.

The semiconducting material of opposite conductivity type may be non-ferromagnetic.

According to a second aspect of some embodiments of the present invention there is provided a method of operating a device comprising a channel for charge carriers comprising non-ferromagnetic semiconducting material in which charge carriers exhibit spin-orbit coupling, a region of semiconducting material of opposite conductivity type to the channel and configured so as to form a junction with the channel for injecting spin-polarised charge carriers into an end of the channel and at least one lead connected to the channel for measuring a transverse voltage across the channel, the method comprising illuminating the junction with light and measuring bias(es) at the lead(s).

The method may further comprise applying a bias between the region and a second end of the channel.

According to a third aspect of certain embodiments of the present invention there is provided a method of fabricating a device, the method comprising providing a channel for charge carriers comprising non-ferromagnetic semiconducting material in which charge carriers exhibit spin-orbit coupling, providing a region of semiconducting material of opposite conductivity type to the channel and configured so as to form a junction with the channel for injecting spin-polarised charge carriers into an end of the channel and providing at least one lead connected to the channel for measuring a transverse voltage across the channel.

The method may comprise providing a layer structure comprising first and second adjacent and/or overlying channels and etching a portion of one of the channels so as to leave the region and the channel.

BRIEF DESCRIPTION OF THE DRAWINGS

Certain embodiments of the present invention will now be described, by way of example, with reference to the accompanying drawings in which.

DETAILED DESCRIPTION OF CERTAIN EMBODIMENTS

Device Structure

Figure 1:
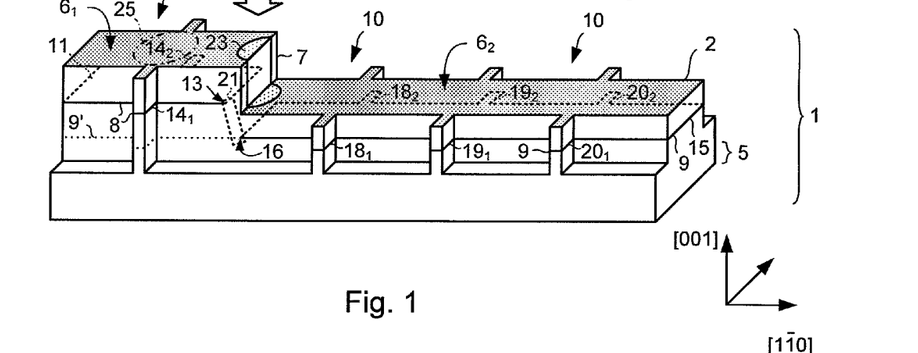
FIG. 1 is a perspective schematic view of a device in accordance with certain embodiments of the present invention.
Figure 1A:
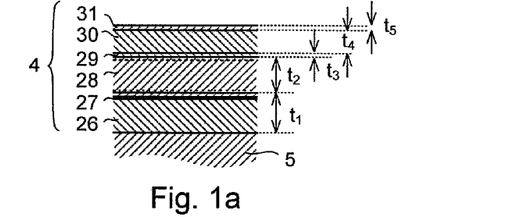
FIG. 1a illustrates a layer structure used to form the device shown in FIG. 1.

Referring to FIGS. 1, 1a and 2 to 5, an electro-optical, spin-polarised charge carrier device 1 is shown. The device 1 comprises a mesa 2 defined by trench isolation using etched trenches 3. The mesa 2 is used to pattern an aluminium gallium arsenide/gallium arsenide (AlGaAs/GaAs) heterostructure 4 on an undoped GaAs substrate 5 (FIG. 1a). The mesa 2 is stepped having upper, un-etched level $6_1$ and lower, etched level $6_2$. Thus, the mesa 2 is divided into first and second parts $2_1$, $2_2$ along a step edge 7. The mesa 2 is stepped so as to form a two-dimensional hole gas (2DHG) 8 in the first part of the mesa $2_1$ and a two-dimensional electron gas (2DEG) 9 in the second part of the mesa $2_2$. The 2DEG 9 is populated with electrons having a sheet concentration $n_{2DEG}=2.5\times10^{11}$ cm$^{-2}$ and a mobility of $\mu=3\times10^3$ cm$^2$/Vs. However, a portion 9' of the 2DEG which lies beneath the 2DHG 8 is depleted.

Figure 2:
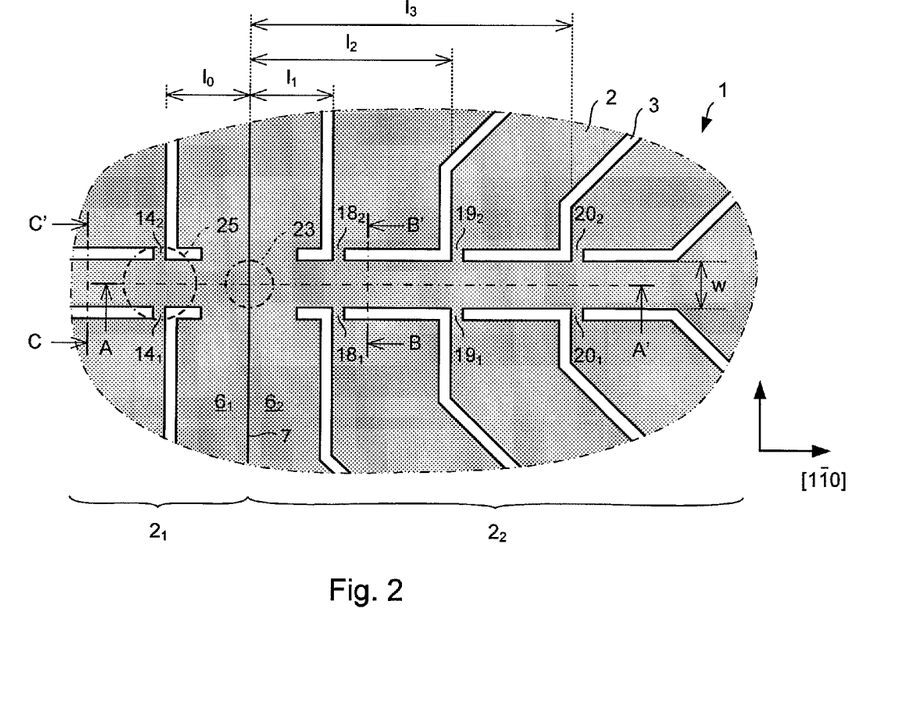
FIG. 2 is a plan view of the device shown in FIG. 1.
Figure 3:
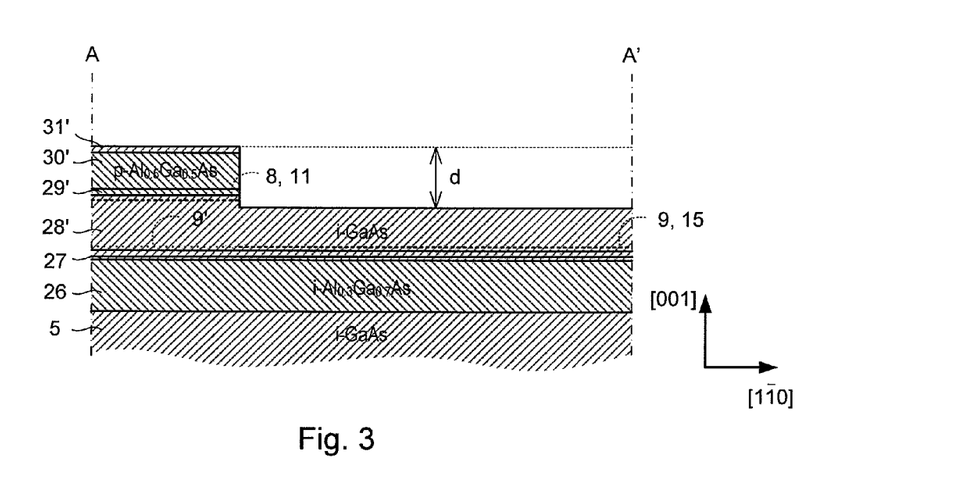
FIG. 3 is a cross section view of the device shown in FIGS. 1 and 2 taken along the line A-A.
Figure 4:
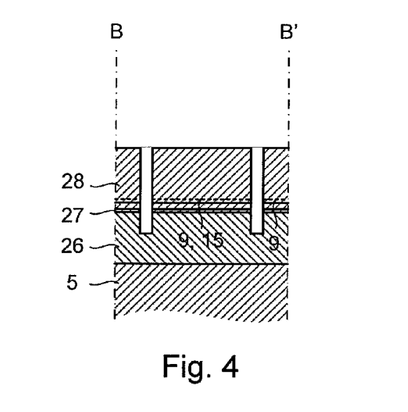
FIG. 4 is a cross section view of the device shown in FIGS. 1 and 2 taken along the line B-B'.
Figure 5:
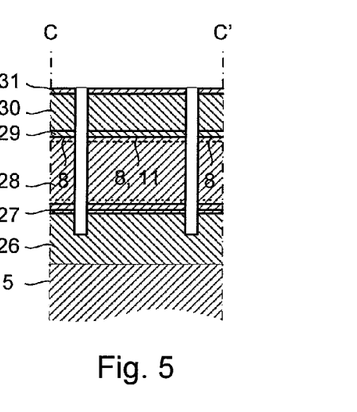
FIG. 5 is a cross section view of the device shown in FIGS. 1 and 2 taken along the line C-C'.

The mesa 2 includes a Hall bar structure 10 which crosses the step edge 7. The structure 10 defines an elongate 2DHG channel 11 extending between a first end and a second end 13 and having a pair of lateral Hall contacts $14_1$, $14_2$ (or "probes") for sensing a transverse voltage across the channel 11. The structure 10 also defines an elongate 2DEG channel 15 extending between first end 16 and a second end and having three pair of lateral probes $18_1$, $18_2$, $19_1$, $19_2$, $20_1$, $20_2$ spaced along the channel 15, each pair of probes $18_1$, $18_2$, $19_1$, $19_2$, $20_1$, $20_2$ for sensing a transverse voltage across the channel 15.

The channels 11, 15 are arranged end-to-end, orientated along the [1-10] direction, and have a width, w, of about 1 μm wide. The 2DHG Hall contacts $14_1$, $14_2$ are separated from the p-n junction by a distance, $l_0$, of about 1.5 μm. Herein, measurements made using this pair of contacts $14_1$, $14_2$ are labelled as "p" measurements. The first pair of 2DEG Hall bar contacts $18_1$, $18_2$ are separated from the p-n junction by a distance, $l_1$, of about 1.5 μm. The second pair of 2DEG Hall bar contacts $19_1$, $19_2$ spaced from the p-n junction by a distance, $l_2$, of about 3.5 μm. The third pair of 2DEG Hall bar contacts $20_1$, $20_2$ are separated from the p-n junction by a distance, $l_3$, of about 5.5 μm. Measurements made using the first, second and third set of 2DEG Hall contacts $18_1$, $18_2$, $19_1$, $19_2$, $20_1$, $20_2$ are labelled "n1", "n2" and "n3" respectively.

A p-n junction 21 is formed between the second end 13 of the 2DHG channel 11 and the first end 16 of the 2DEG channel 15 beneath the step edge 7.

A laser 22, tuned to a wavelength of about 850 nm, is used to illuminate a spot 23 having a diameter of about 1 μm in the vicinity of the step edge 7 from the 2DHG 8. Under illumination, photo-excited electrons and holes are driven in opposite directions in the respective 2DEG and 2DHG channels 11, 15. Polarization of the laser beam is controlled by a photo-elastic modulator 24. As will be explained later, the laser 23 is also used to illuminate another spot 25 having a diameter of about 2 μm in the vicinity of the 2DHG Hall contacts $14_1$, $14_2$.

Referring in particular to FIG. 1a, the heterostructure 4 includes a layer 26 of undoped $Al_{0.3}Ga_{0.7}As$ having a thickness, $t_1$, of about 300 nm. An n-type δ-doped layer 27 having a concentration of about $5\times10^{12}$ cm$^{-2}$ is embedded 3 nm from the upper surface of the $Al_{0.3}Ga_{0.7}As$ layer 26.

The heterostructure further includes, a layer 28 of undoped GaAs having a thickness, $t_2$, of about 90 nm, a spacer layer 29 of undoped $Al_{0.5}Ga_{0.5}As$ having a thickness, $t_3$, of about 3 nm, a layer 30 of p-type $Al_{0.5}Ga_{0.5}As$ having a thickness, $t_4$, of about 47 nm and a capping layer 31 of p-type GaAs having a thickness, $t_5$, of about 5 nm.

Where the GaAs layer 28 is partially removed, e.g. by about 10 nm, and the overlying p-type layers 28, 29, 31 of the heterostructure 4 are removed to form patterned layer 28', 29', 30', 31' a first conductive sheet of a first conductivity type, i.e. 2DHG 8, is formed in an upper part of the patterned undoped GaAs layer 28', while a second conductive sheet of a second conductivity type, i.e. a 2DEG 9, is formed in a lower part of the same layer 28'. This technique is described in EP-A-1 501 134. The GasAs layer 28 need not be etched.

Figure 6:
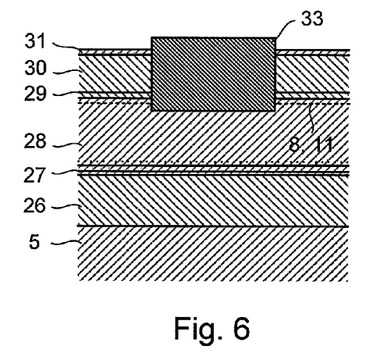
FIG. 6 is a cross section view of an ohmic contact to a first conductive layer in the device shown in FIGS. 1 and 2.

Referring to FIG. 6, a AuZn alloy is used to form p-type ohmic contacts 33 to the 2DHG Hall bar channel 11, which may define one end of the channel 11, and other portions of the 2DHG 8 (FIG. 1) providing the 2DHG Hall bar contacts $14_1$, $14_2$ (FIG. 1).

Figure 7:
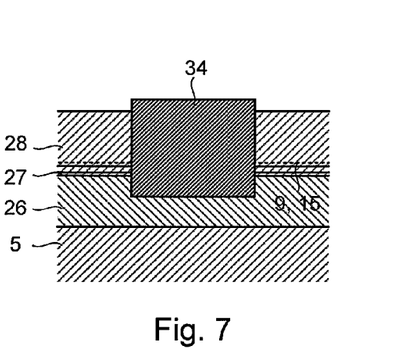
FIG. 7 is a cross section view of an ohmic contact to a first conductive in the device shown in FIGS. 1 and 2.

Referring to FIG. 7, a AuGeNi alloy is used to form n-type contacts 34 to the 2DEG Hall bar channel 15, which may define one end of the channel 15, and other portions of the 2DEG 9 (FIG. 1) providing the 2DEG Hall bar contacts $18_1$, $18_2$, $19_1$, $19_2$, $20_1$, $20_2$ (FIG. 1).

Fabrication

Figure 8:
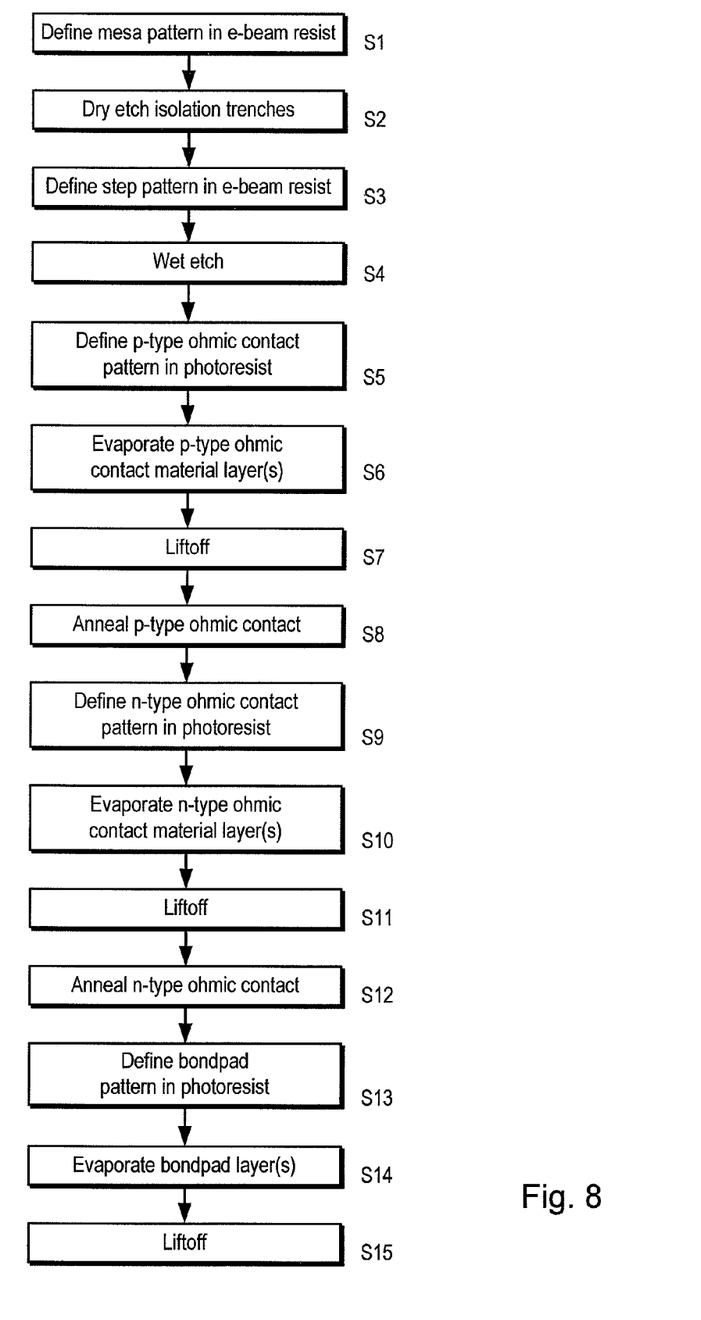
FIG. 8 is a process flow diagram of a method of fabricating the device shown in FIGS. 1 and 2.

Referring to FIG. 8, a flow diagram of a method of fabricating the device 1 is shown.

Starting with a chip containing the layer structure 4 (FIG. 1a), a pattern outlining the mesa 2 (FIG. 2) is defined in a resist (not shown) (step S1). An electron-beam resist, namely polymethylmethacrylate (PMMA), is applied by spin coating to surface of the chip, an electron beam is used to expose selective areas of the resist and the resist is developed.

The pattern of the resist is transferred to the chip by anisotropic dry etching (step S2), namely a $SiCl_4$/Ar reactive ion etch at 20 mTorr chamber pressure.

The pattern of the 2DEG is defined in a resist (not shown) (step S3). Another layer of electron-beam resist is applied by spin coating to surface of the chip, an electron beam is used to expose selective areas of the resist and the resist is developed.

The pattern of the resist is transferred to the chip by wet etching (step S4), namely using a slow, timed wet etch comprising $H_2SO_4$, $H_2O_2$ (30%) and $H_2O$ (1:8:1000).

P-type ohmic contacts 33 (FIG. 6) to the 2DHG channel 11 (FIG. 1) and Hall probe electrodes 14$_1$, 14$_2$ (FIG. 1) are fabricated (steps S5 to S8). The pattern of the p-type ohmic contacts is defined in optical resist (not shown) (step S5), material for forming a p-type ohmic contact, namely AuZn alloy (5% Zn by weight), is thermally evaporated (step S6) and unwanted regions of material are lifted off in acetone (step S7). The p-type ohmic contact is anneal (step S8) by annealing the sample for 5-minutes at 440° C. in a forming gas (5% H, in $N_2$).

N-type ohmic contacts 34 (FIG. 7) to the 2DEG channel 15 (FIG. 1) and corresponding Hall probe electrodes 18$_1$, 18$_2$, 19$_1$, 19$_2$, 20$_1$, 20$_2$ (FIG. 1) are fabricated (steps S9 to S12). The pattern of the n-type ohmic contacts are defined in optical resist (not shown) (step S9), material for forming an n-type ohmic contact, namely a AuGeNi alloy (AuGe 88:12, 5% Ni), is thermally evaporated (step S10) and unwanted regions of material are lifted off in acetone (step S11). The n-type ohmic contact is annealed (step S12) by annealing the sample for 5-minutes at 400° C. in a forming gas (5% H, in $N_2$).

Finally, large-area bond pads (not shown) for wire bonding are defined (steps S13 to S15). The pattern of the bond pads are defined in optical resist (not shown) (step S13), material for forming bond pads, namely a sticking layer of Cr followed by a layer of Au, is thermally evaporated (step S14) and unwanted regions of material are lifted off in acetone (step S15).

Operation

Figure 9:
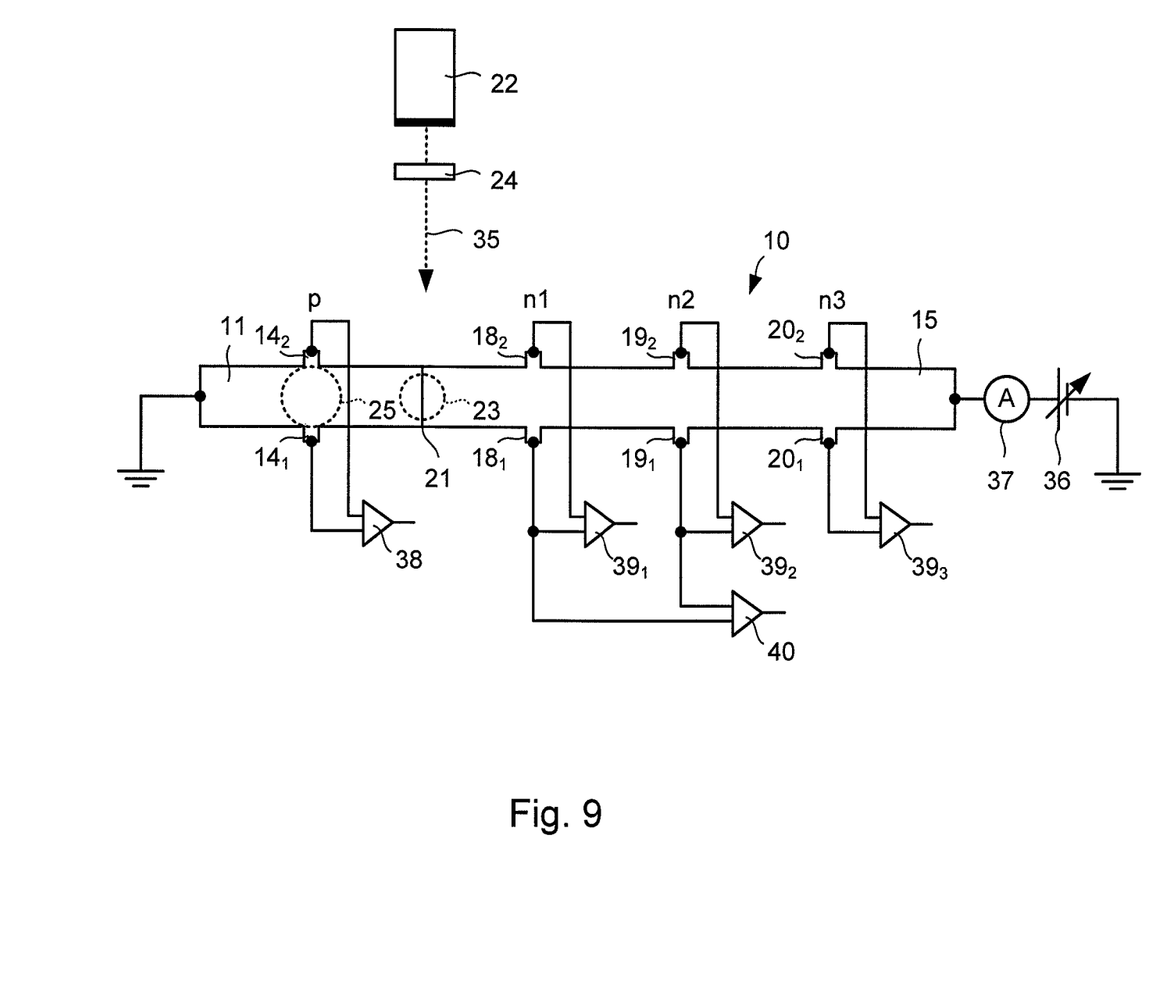
FIG. 9 illustrates measurement of the device shown in FIGS. 1 and 2.

Hall voltage signals and photocurrent are detected simultaneously using a lock-in technique, as will now be described:

Referring to FIG. 9, a continuous wave Ti:sapphire laser 22 is used to generate a beam 35 of monochromatic light of adjustable wavelength in the near infrared sub-GaAs band-gap spectrum between 820 nm to 860 nm. After passing the beam 35 through an attenuator (not shown), the beam 35 is successively chopped at a low frequency of about 150 Hz. A successive beam splitter (not shown) combined with a photodiode detector (not shown) and a successive lock-in amplifier (not shown) is employed to monitor intensity fluctuations of the beam 35.

Using a linear polarizer and a λ/2 wave-plate, a second part of the beam 35 is linearly polarized at 45° with respect to the optical axis of a photo-elastic modulator 24 with adjustable retardation and a modulator frequency of 50 kHz. Retardation of ±90° generates circular left/right polarized light, retardation of 0° and 180° generates linearly polarized light at ±45°.

The beam 35 is focused to a spot size of about 1 μm on the optically active area of the lateral p-n junction Hall bar device by using a pin-hole (not shown) and a high-resolution microscope objective (not shown) mounted to a high precession piezoelectric x-y-z stage (not shown). An additional beam-splitter (not shown) combined with an objective (not shown) and a CCD camera (not shown) allows the beam 35 to be aligned to Hall bar structure.

The device 1 is mounted in an Oxford Instruments Microstat High Resolution continuous flow cryostat (not shown) with adjustable measurement temperature ranging from less than 4° K. up to room temperature.

A voltage source 36 is used to reverse bias the p-n junction 21. Photo-excited current through the reverse biased p-n junction 21 is measured using an arrangement 37 including a SR570 current preamplifier (not shown) connected to a lock in amplifier (not shown) with the reference frequency of the chopped light beam.

The intensity of the beam 35 is attenuated to generate a photocurrent along the Hall bar of approximately 500 nA. The Hall probes 14$_1$, 14$_2$, 18$_1$, 18$_2$, 19$_1$, 19$_2$, 20$_1$, 20$_2$ are connected to SR560 high impedance pre-amplifiers 38, 39 and are successively connected to lock-in amplifiers (not shown) with the reference frequency of the photo-elastic modulator 24.

An additional high-impedance preamplifier 40 combined with a lock-in amplifier (not shown) is used to monitor a longitudinal voltage drop between two adjacent Hall probe contacts 18$_1$, 19$_1$.

Figure 10:
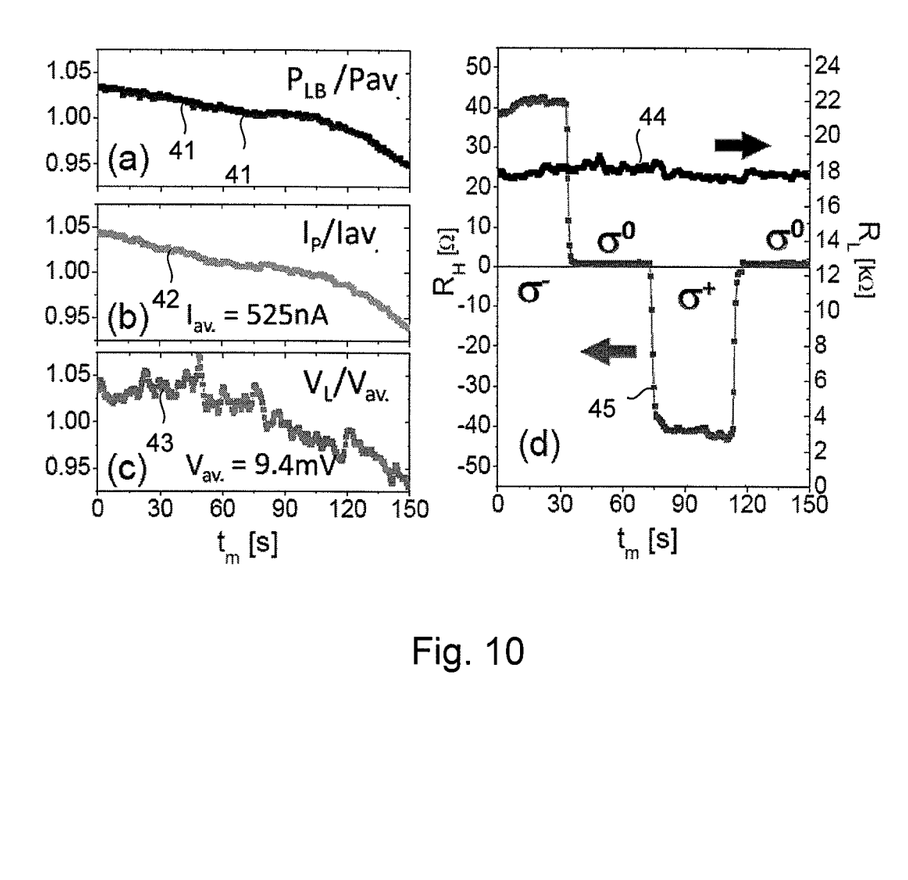
FIGS. 10a to 10d illustrates plots of light intensity, photocurrent, longitudinal voltage and Hall resistances in time.

Referring to FIGS. 10a, 10b and 10c, time plots of simultaneously-measured light intensity 41, photocurrent 42 and longitudinal voltage 43 are shown.

FIGS. 10b and 10c show that as light intensity drifts, then the photocurrent and longitudinal voltage also drift.

FIG. 10d shows time plots 44 and 45 of simultaneously-measured (i.e. simultaneous with the measurements shown in FIGS. 10a, 10b and 10c) transverse Hall and longitudinal Hall resistance $R_H$, $R_L$.

FIG. 10d shows both Hall resistance, $R_H$, and the longitudinal Hall resistance, $R_L$, are independent of the light intensity variation.

The transverse Hall resistance, $R_H$, measured using the second Hall probe 19$_1$, 19$_2$, depends only on the light polarization. The transverse Hall resistance, $R_H$, is zero at linear polarization $\sigma_0$ and changes sign for opposite circular polarized light $\sigma_\pm$.

The larger variation of transverse Hall resistance, $R_H$, at $\sigma\pm$ can be attributed to a small drift of the beam spot and, therefore, the injection point of the spin-polarized current during the measurement time.

Figure 11:
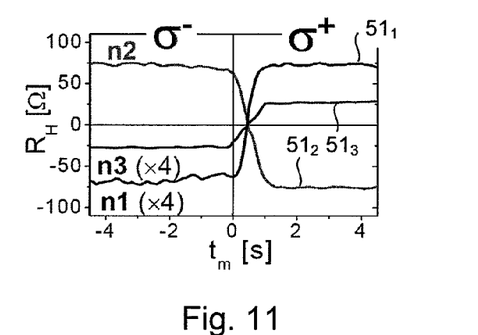
FIG. 11 is a plot of Hall resistance with time for three different sets of probes for the device shown in FIGS. 1 and 2.

Referring to FIG. 11, plots of Hall resistances 51$_1$, 51$_2$, 51$_3$ as shown measured by the three pairs of 2DEG Hall probes 18$_1$, 18$_2$, 19$_1$, 19$_2$, 20$_1$, 20$_2$ at a reverse bias of −10 V at 4° K. are shown.

The Hall resistances 51$_1$, 51$_2$, 51$_3$ are antisymmetric with respect to the helicity of the circularly polarized light 35 (FIG. 9). Due to the optical selection rules, the spin-polarization of the injected carriers is determined by the polarization of the incident light. In other words, the sign of the Hall resistances 51$_1$, 51$_2$, 51$_3$ reverses upon reversing the out-of-plane spin-polarization of the optically-generated conduction electrons. For a fixed helicity of light, the Hall resistances 51$_1$, 51$_2$, 51$_3$ measured at different positions along the planar 2DEG channel 15 change not only magnitude, but also sign.

The presence and spatial non-uniformity of the Hall resistances 51$_1$, 51$_2$, 51$_3$ are due to spin-orbit coupling effects. Depending on the out-of-plane component of their spin, electrons are asymmetrically deflected towards the edges of the 2DEG channel creating a finite Hall voltage. The spatial dependence of the signal reflects the reciprocal effect of the coupled spin-charge dynamics in which spins rotate while passing along the 2DEG channel 15.

Figure 12:
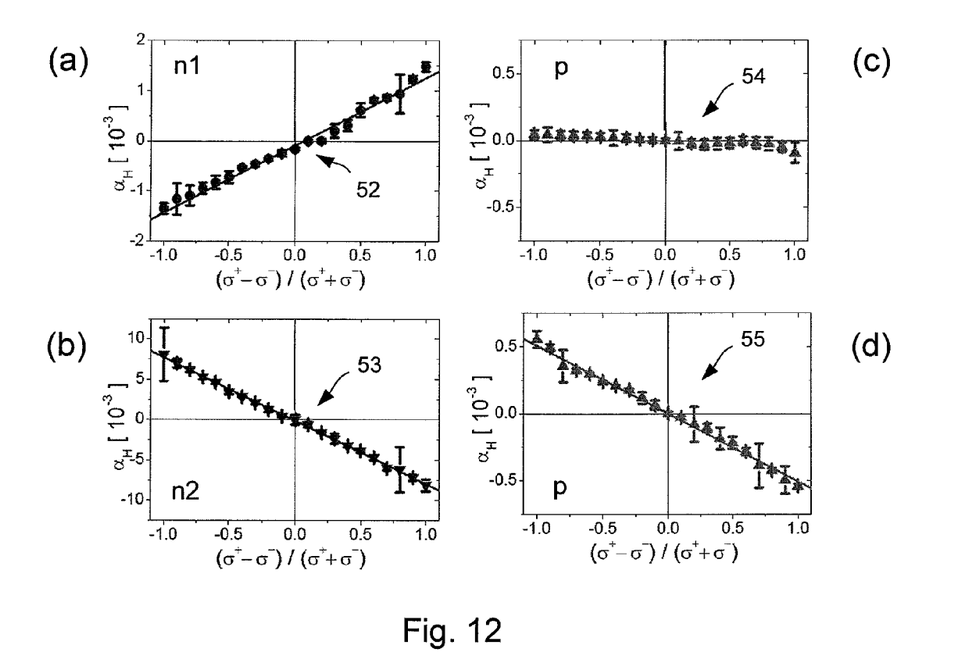
FIGS. 12a to 12d are plots of Hall signals at different parts of the device shown in FIGS. 1 and 2 as a function of degree of circular polarisation.

Referring to FIGS. 12a and 12b, dependences 51, 52 of 2DEG Hall signals on the degree of circular polarization of the incident light are shown. A Hall angle, $\alpha_H$, is defined as the ratio between longitudinal sheet resistance, measured between successive Hall contacts $18_1$, $19_1$, and transverse resistances, $18_1$, $18_2$, $19_1$, $19_2$.

As shown in FIGS. 12a and 12b, the Hall signals 52, 53 are linear in the degree of polarization and the magnitude of the Hall signals is large.

Referring to FIGS. 12c and 12d, dependences 53, 54 of Hall measurements in the 2DHG channel 11 are shown.

In FIG. 12c, the measurement is taken with the beam 35 (FIG. 9) located in the first spot 23 (FIG. 9). In FIG. 10d, the measurement is taken with the beam 35 (FIG. 9) located in the second spot 25 (FIG. 9).

As shown in FIG. 12c, no strong signal is found with the laser 35 (FIG. 9) focused on the p-n junction 21 (FIG. 9), i.e. in the first spot 23 (FIG. 9). This is consistent with a substantially smaller spin coherence length in the strongly spin-orbit coupled 2DHG.

However, as shown in FIG. 12d, a strong transverse-voltage signal is observed when uniformly polarizing a larger area of the 2DHG channel 11 (FIG. 9) around the Hall probe $14_1$, $14_2$ (FIG. 9).

Figure 13:
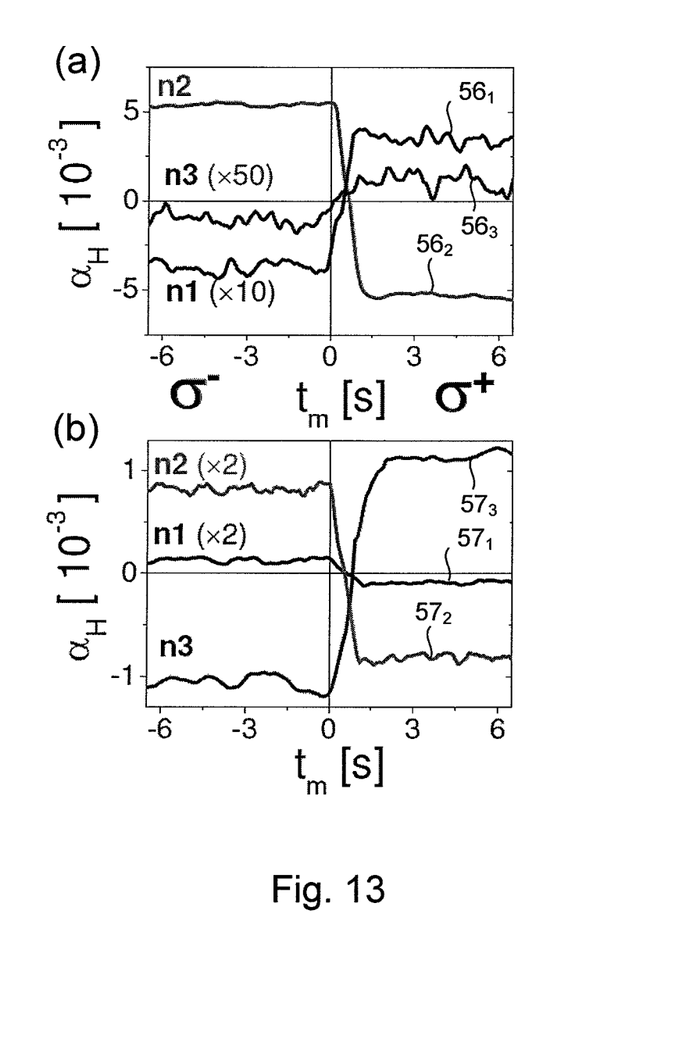
FIG. 13a is a plot of Hall resistance with time for three different sets of probes for the device shown in FIG. 1 in the absence of applied bias taken at 4° K.
FIG. 13b is a plot of Hall resistance with time for three different sets of probes for the device shown in FIG. 1 in the absence of applied bias taken at 230° K.

Referring to FIG. 13a, plots of Hall signals $56_1$, $56_2$, $56_3$ measured by the three 2DEG Flail probes $18_1$, $18_2$, $19_1$, $19_2$, $20_1$, 20, (FIG. 9) at zero bias at 4° K. are shown.

As shown in FIG. 13a, the device 1 (FIG. 9) operates as a spin photovoltaic cell, i.e. it can operate even when no external electrical bias is applied. Both the longitudinal and Hall resistivities at zero bias remain comparable to the respective signals measured under reverse bias, yielding only weakly bias dependent Hall angles. The measured differences between the zero and finite bias Hall signals can be attributed to variations in the optical excitation conditions.

Referring to FIG. 13b, plots of Hall signals $57_1$, $57_2$, $57_3$ measured by the three 2DEG Hall probes $18_1$, $18_2$, $19_1$, $19_2$, $20_1$, $20_2$ (FIG. 9) at zero bias at 230° K. are shown.

The p-n junction leakage current is still negligible. FIG. 13b demonstrates that the photovoltaic and spin-orbit coupling effects are readily detectable at high temperatures.

Although the spin-generation conditions vary with changing temperature due to thermal drifts, the following observations can be made.

Firstly, at all measured temperatures, an upper bound for the spin-precession wavelength can be inferred, estimated from the measurements made by the three Hall probes $18_1$, $18_2$, $19_1$, $19_2$, $20_1$, $20_2$ (FIG. 9) and which is of the order of a micrometer.

Secondly, a spin-coherence length of at least a few micrometers can be observed as illustrated, for example, by the largest signal measured at the third Hall probe $20_1$, $20_2$ (FIG. 9) at 230° K. This implies that multiple-probe planar structures can be fabricated, for example, by electron-beam lithography and used for detailed studies of spin-precession and decoherence effects in 2D semiconductor channels.

Thirdly, external electric gates can be used to control spin-dynamics and so provide a means for realizing and exploring the Datta-Das transistor functionality beyond the originally-proposed concept based on longitudinal transport detection scheme.

Fourthly, the 2DEG channel 15 (FIG. 9) can be used to achieve strong spin-charge coupling effects while maintaining large spin-coherence of diffusing carriers in 2D systems with Rashba and Dresselhaus spin-orbit coupling.

The behaviour can be described based on the observation that the micrometer length scale governing the spatial dependence of the non-equilibrium spin-polarization is much larger that the ~20 nm mean-free-path in the 2DEG channel 11 (FIG. 9) which governs the transport coefficients.

This allows the steady-state spin-polarization profile along the channel to be calculated and then consider the spin-injection Hall effect as a response to the local out-of-plane component of the polarization.

Modelling

Calculations start from the electronic structure of GaAs whose conduction band near the Γ-point is formed dominantly by Ga s-orbitals. This implies weak spin-orbit coupling originating from the mixing of the valence-band p-orbitals and from the broken inversion symmetry in the zincblende lattice.

In the presence of an electric potential, the corresponding 3D spin-orbit coupling Hamiltonian is $$H_{3D-SO} = [\lambda^* \sigma \cdot (k \times \nabla V(r))] + [\beta k_x (k_y^2 - k_z^2) \sigma_x + \text{cyclic permutations}] \quad (1)$$

where σ are the spin Pauli matrices, k is the momentum of the electron, $\beta \approx 10$ eVÅ$^3$, and $\lambda^* = 5.3$ Å$^2$ for GaAs. Equation (1) above, together with the 2DEG confinement yield an effective 2D Rashba and Dresselhaus spin-orbit couple Hamiltonian, namely:

$$H_{2DEG} = \frac{\hbar^2 k^2}{2m} + \alpha(k_y \sigma_x - k_x \sigma_y) + \beta(k_x \sigma_x - k_y \sigma_y) \quad (2)$$

where m=0.067 $m_e$, $\beta = -\beta(k_z^2) \approx -0.02$ eVÅ (i.e. Dresselhaus term) and $\alpha = e\lambda^* E_z \approx 0.01-0.03$ eVÅ (i.e. Rashba term) for the strength of the confining electric field, $eE_z \approx 2-5 \times 10^{-3}$ eV/Å, estimated from a self-consistent conduction band profile of the GaAs/AlGaAs heterostructure 4 (FIG. 1a).

The parameter $\lambda^*$ is the spin-orbit strength which can be calculated by:

$$\lambda^* = \frac{p^2}{3}\left(\frac{1}{E_g^2} - \frac{1}{(E_g + \Delta_{so})^2}\right) \quad (3)$$

where $E_g$ is the band gap and p is the momentum operator and $\Delta_{so}$ is the spin-orbit split-off hole band position.

In the weak spin-orbit coupling regime of our structure with $\alpha k_F$ and $\beta k_F$ (~0.5 meV) much smaller than the disorder scattering rate $b/\tau$ (~5 meV), the system obeys a set of spin-charge diffusion equations. In the steady-state, the spatial dependence of the out-of-plane component of the spin polarization along the [1-10] channel direction is given by a damped oscillatory function $$p_z(x_{[1\bar{1}0]}) = \exp(qx_{[1\bar{1}0]}) \quad (4)$$

with the complex wavevector $$q = |q|\exp(i\theta) \quad (5)$$

where $$|q| = \left(\tilde{L}_1^2 \tilde{L}_2^2 + \tilde{L}_2^4\right)^{1/4} \quad (6)$$

$$\theta = \frac{1}{2}\arctan\left(\frac{\sqrt{2\tilde{L}_1^2 \tilde{L}_2^2 - \tilde{L}_1^4/4}}{\tilde{L}_2^2 - \tilde{L}_1^2/2}\right) \quad (7)$$

and $$L_{1/2} = 2m|\alpha \pm \beta|/\hbar^2 \quad (8)$$

From the known local spin-polarization, the Hall signal can be calculated by taking into account that the dominant contribution in the weak spin-orbit coupling regime is the extrinsic skew scattering. This contribution is obtained by considering asymmetric scattering from a spin-orbit coupled impurity potential originating from the first term in equation (1) above.

Within the second-order Born approximation for delta-function scatterers, a spatially dependent spin-injection Hall effect angle and be obtained, namely:

$$\alpha_H(x_{[1\bar{1}0]}) = 2\pi\lambda^* \sqrt{\frac{e}{\hbar n_i \mu}} n p_z(x_{[1\bar{1}0]}) \quad (8)$$

where n is the density of optically injected carriers into the 2DEG channel 15 (FIG. 8).

Figure 14:
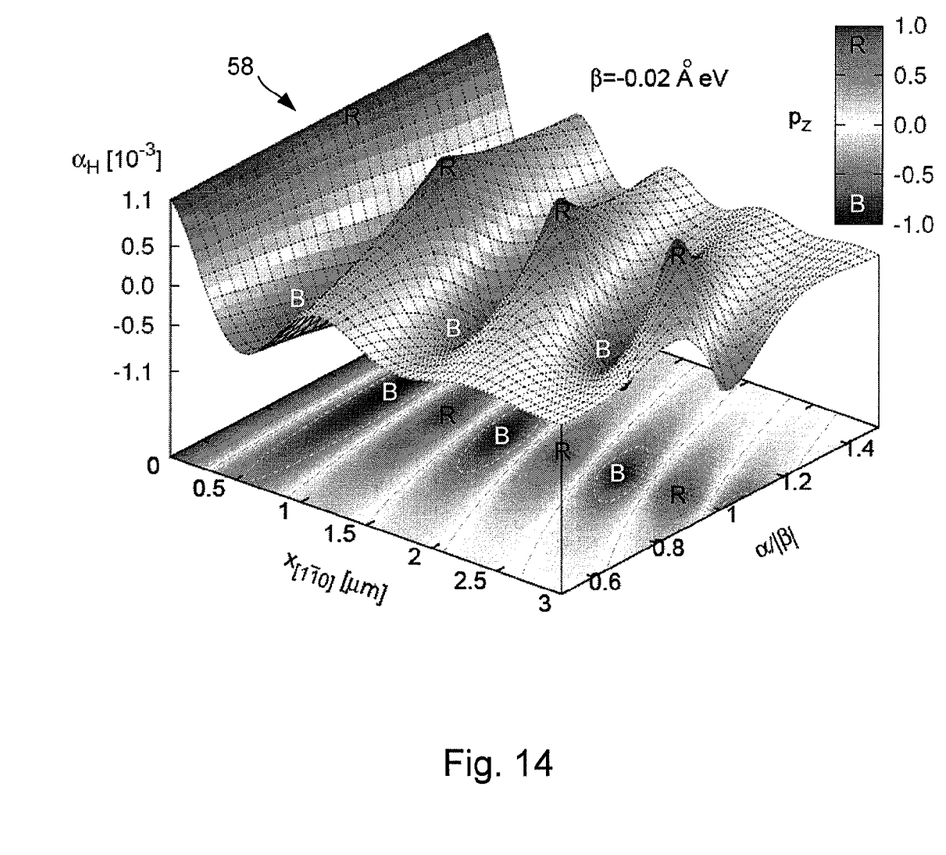
FIG. 14 is a plot of Hall angle for different values of Rashba and Dresselhaus constants.

FIG. 14 is a plot 58 of $\alpha_H$ along the [1-10] direction for different ratios $\alpha/|\beta|$ of Rashba and Dresselhaus parameters.

It has been assumed that the donor impurity density $n_i$ is of the order of the equilibrium density $n_{2DEG}$ of the 2DEG channel 15 (FIG. 8) in dark, which provides an upper bound for the strength of the impurity scattering in the modulation-doped heterostructure and, therefore, a lower bound for the Hall angle. It has also been assumed that the mobility of the 2DEG channel 15 (FIG. 8) is the same as that determined from an ordinary Hall measurement without illumination. The density of photoexcited carriers of $n \approx 2 \times 10^{11}$ cm$^{-2}$ was obtained from the measured longitudinal resistance between successive Hall probes under illumination assuming constant mobility.

The plot 58 shown in FIG. 14 is consistent with the measured behaviour of the device and the value of the precession length obtained by the calculation and the value inferred from experiment are consistent.

Figure 15:
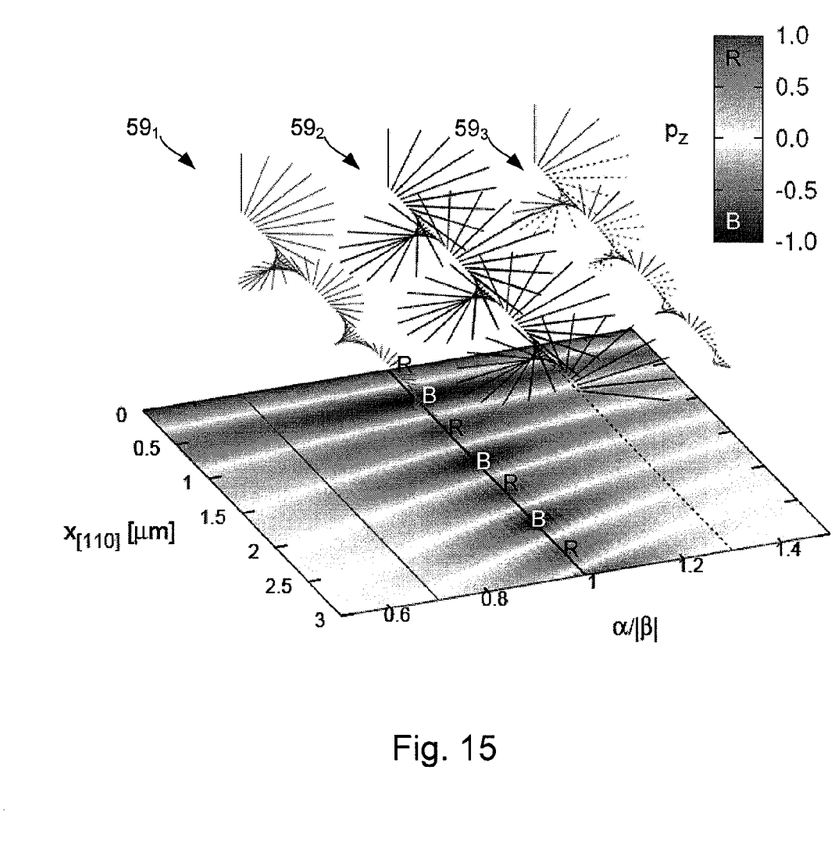
FIG. 15 illustrates precession of charge carrier spin along a channel for three different ratios of Rashba and Dresselhaus constants.

FIG. 15 shows how spin processes along the 2DEG channel 15 (FIG. 8) for three different values of $\alpha/|\beta|$, namely 0.7, 1.0, 1.3.

FIG. 15 shows that if spin-polarized electrons with polarization along the [1-10] crystalline orientation are injected at a point $x_0$ and propagate through a 2D system at spin-Helix conditions, the perpendicular-to-the-plane-oriented polarization of the injected electrons recovers at multiples of $x_p$=h/(4.m.$\alpha$) along the [1-10] orientation, where h is Plank's constant, m is the effective mass of the electron and $\alpha$ is the Rashba spin-orbit interaction term. The length, $x_p$, is independent of the number of times the electron scatters from the injection point, $x_0$, to $x_{PN}$=N.$x_p$, where N is an integer. Between $x_{PN}$ and $x_{P(N+1)}$, electron polarization completes one full precession as shown in FIG. 14.

In case of the absence of a Dresselhaus term or when there is a large difference between $|\alpha|$ and $|\beta|$, the net spin polarization of the electron current will de-phase and spin-polarization lost, typically within a sub-micrometer length scale.

Other Device Configurations

Figure 16:
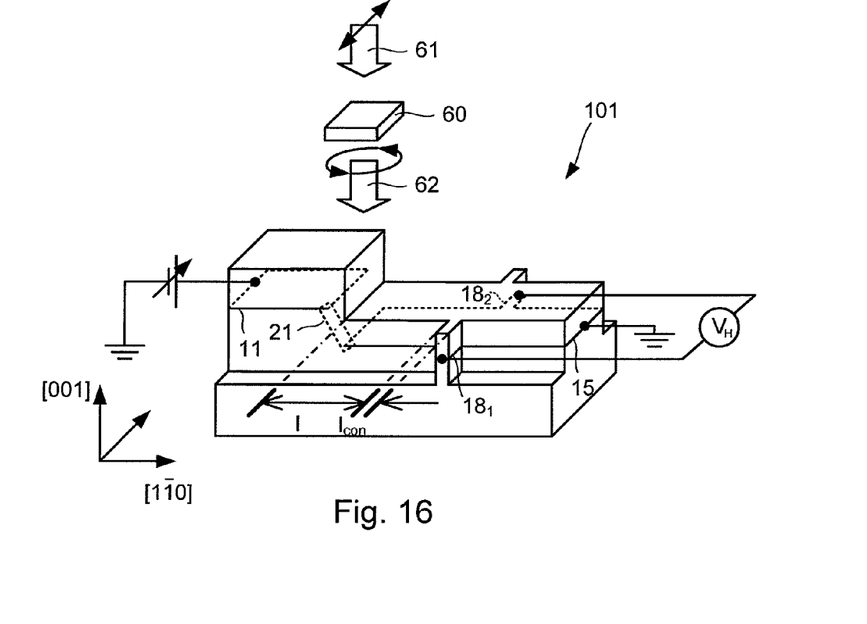
FIG. 16 illustrates another embodiment of a device in accordance with some embodiments of the present invention.

Referring to FIG. 16, a second, simpler device 101 is shown.

The second device 101 is similar to the device 1 described earlier. However, no Hall contacts need be connected to the 2DHG channel 11 and the device 101 may include only one pair of Hall contacts $18_1$, $18_2$ connected to the 2DEG channel 15 spaced from the p-n junction 21 by a distance, l.

A quarter-wave plate 60 (or "λ/4 plate") can be used to convert linearly-polarized light 61, $\sigma^0$, into circularly polarized light 62, $\sigma^+$. The Hall voltage is proportional to the degree of linear polarization with the polarization plane 45° to the optical axis of the quarter-wave plate 60.

The Hall contacts $18_1$, $18_2$ may be spaced from the p-n junction 21 by a distance l=N.$x_p$/2=N.(h/8.m.$\alpha$) where N is an integer. The length, $l_{con}$, of the contact $18_1$, $18_2$ is much smaller than l, i.e. l<<N.$x_p$/2

The device 101 exploits the spin helix. In the case that $\alpha \approx +(-)\beta$, then the spin polarization precesses within the [001]/[110] (or [001]/1-10]) plane and the local spin-injection Hall effect signal (which is proportional to the z-component of the polarization vector) along the [001]/[110] channel direction can be detected. The magnitude of the signal is maximal if the contacts are at an integer number of half of the precession length from the injection area.

The Hall contacts $18_1$, $18_2$ may be spaced from the p-n junction 21 by a distance l<$x_p$/2. Thus, polarization is detected in an area which is close to the injection area. The length, $l_{con}$, of the contact $18_1$, $18_2$ is much smaller than l, i.e. $l_{con}$<<N.$x_p$/2.

The Hall contacts $18_1$, $18_2$ need not be spaced from the p-n junction 2, i.e. l=0. Thus, polarization is detected across the injection area. The length, $l_{con}$, of the contacts $18_1$, $18_2$ can be the same size, i.e. $l_{con}$<<N.$x_p$/2, or may be about the same as the beam width.

Figure 17:
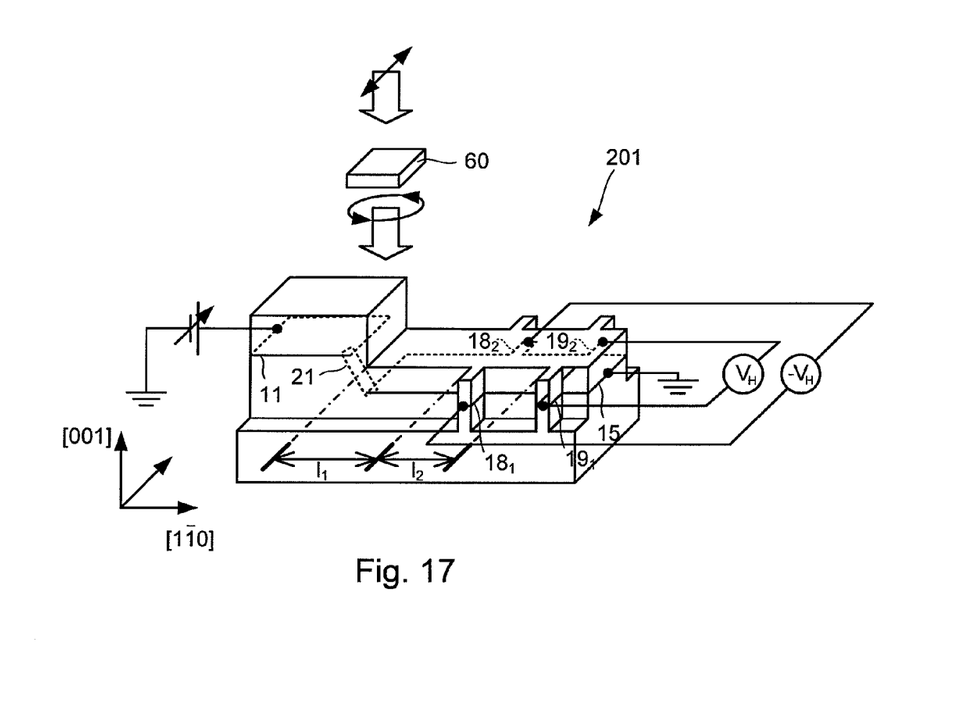
FIG. 17 illustrates yet another embodiment of a device in accordance with certain embodiments of the present invention.

Referring to FIG. 17, a third device 201 is shown which can be used as polarimeter.

The third device 201 is similar to the second device 1. Again, no Hall contacts need be connected to the 2DHG channel 11. In this case, however, the device 201 includes two pairs of Hall contacts $18_1$, $18_2$, $19_1$, $19_2$ connected to the 2DEG channel 15. The first set of Hall contacts $18_1$, $18_2$ are spaced from the p-n junction 21 by a distance $l_1$=N.$x_p$/2=N.(h/8.m.$\alpha$) and the second set of Hall contacts $19_1$, $19_2$ are placed a further distance, $l_2$, from the first set, whereby $l_2$=h/8.m.$\alpha$.

Thus, the first set of contacts $18_1$, $18_2$ can be used to obtain a measurement and the second set of contacts $19_1$, $19_2$ can be used to obtain an inverted measurement.

Figure 18:
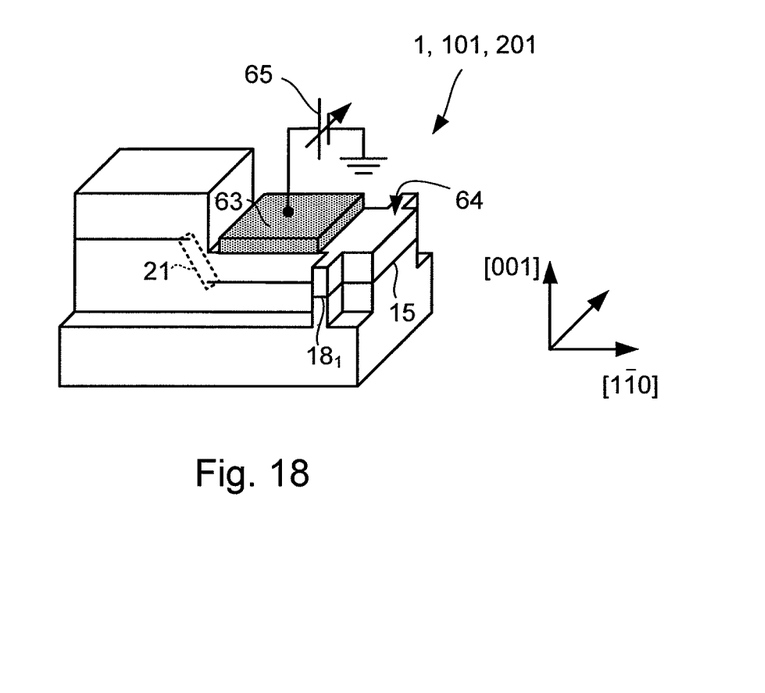
FIG. 18 illustrates a gate for tuning a device.

Referring to FIG. 18, the devices 1, 101, 201 hereinbefore described can be modified by adding a gate electrode 63 on the surface 64 of the lower step mesa $2_2$ for applying a vertical electric field to the 2DEG channel 15 between the junction 21 and the first set of Hall contacts $18_1$ using voltage source 65.

The gate 61 may comprise optically transparent material, such as indium-tin-oxide (ITO).

Figure 19:
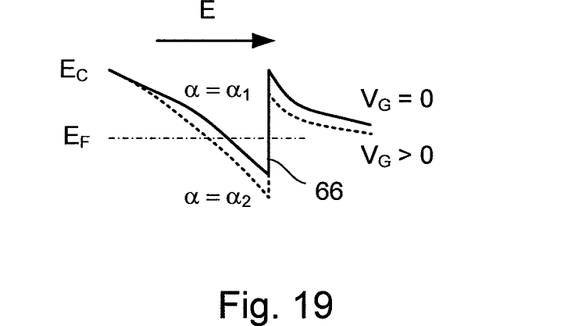
FIG. 19 illustrates effect of a surface gate on a potential well forming a two-dimensional electron gas.

Referring also to FIG. 19, the gate 61 can be used to apply an a field E whereby a potential well 66 forming the 2DEG 9 can be made more asymmetric and, thus, change the value of Rashba coupling constant, $\alpha$. Thus, the device can used to trim the device to ensure that $\alpha/|\beta|$=1.0 and/or that the Hall contacts produce the maximum signal.

It will be appreciated that many modifications may be made to the embodiments hereinbefore described.

For example, the 2DEG and 2DHG layers can be inverted so that the 2DEG layer lies above the 2DHG layer. However, in this case, the 2DEG confining field is negative in the direction of [001] (i.e. as opposed to being positive along [001] as described earlier) and so the channel should be arranged, for example, so that electrons are injected into a channel in the [110] direction.

Furthermore, different material systems may be used. For example, with reference to FIG. 3, $Al_xGa_{1-x}As$ with x>0 may be used for region 28, instead of x=0 as described above. The condition is that x<0.4 for region 28 and that x is larger in regions 26, 29, 30 compared to region 28.

In addition, with the same condition for x with respect to regions 26, 29, 30 on one hand, and region 28 on the other hand, the following III-V material systems may be used, instead of $Al_xGa_{1-x}As$:

$In_{1-x}Al_xAs$ (x=0 ... 0.7)
$In_xGa_xAs$ (x=0 ... 1)
$GaAs_xP_{1-x}$ (x=0 ... 0.5)
$Ga_{1-x}Al_xSb$ (x=0 ... 0.3)
$InAs_{1-x}P_x$ (x=0 ... 1)
$Al_xGa_{1-x}N$ (x=0 ... 1)
$In_{1-x}Ga_xN$ (x=0 ... 1)

Also combinations of these systems are possible, as long as the bandgap of region 28 is smaller than the bandgap of regions 26, 29, 30.

The following II-VI system can also be used, with the same restriction on x, comparing regions 26, 29, 30 on one side and region 28 on the other side:

$Cd_xHg_{1-x}Se$
$TeHg_{1-x}Cd_x$
$Hg_{1-x}Zn_xSe$
$Zn_xCd_{1-x}Se$
$ZnS_xSe_{1-x}$
$ZnS_xTe_{1-x}$

The dimensions of the devices can be changed. For example, the width of the channel, w, may be made smaller, e.g. between about 100 nm and 1 μm, or larger, e.g. between about 1 μm and 10 μm. The length of the channels can also vary. The size and configuration of the Hall contacts can be varied.

The channel may be formed in other ways. For example, a double barrier heterostructure, e.g. AlGaAg/GaAs/AlGaAs can be used to form a planar, i.e. 2D, conductive sheet.

There can be only one lead or only leads along one side of the channel, i.e. the leads need not be arranged on opposite sides of the channel. Thus, a Hall measurement can be taken using one lead and compared to a reference, e.g. ground.

An implanted well can be used to provide one or both halves of the p-n junction 21. Thus, the device may comprise a AlGaAs/GaAs heterostructure providing a 2DEG channel and p-type impurities may be implanted to form the junction.

The invention claimed is:

1. A device comprising:
   a channel for charge carriers comprising non-ferromagnetic semiconducting material in which charge carriers exhibit spin-orbit coupling;
   a region of semiconducting material of opposite conductivity type to the channel and configured so as to form a junction with the channel for injecting spin-polarised charge carriers into an end of the channel; and
   at least one lead connected to the channel for measuring a transverse voltage across the channel.

2. A device according to claim 1, wherein the channel comprises a potential well confining a two-dimensional charge-carrier gas.

3. A device according to claim 2, wherein the potential well is asymmetric.

4. A device according to claim 1, wherein the semiconducting material of opposite conductivity type is a crystal having no inversion symmetry.

5. A device according to claim 1, wherein the non-ferromagnetic semiconducting material comprises a III-V semiconducting material.

6. A device according to claim 1, wherein the conductivity type of the region is p-type and the conductivity type of the channel is n-type.

7. A device according to claim 1, further comprising:
   a gate configured to apply an electric field to the channel.

8. A device according to claim 1, wherein the at least one lead includes leads arranged along one side or opposite sides of the channel.

9. A device according to claim 1, wherein the at least one lead comprises:
   one or two leads spaced from the junction by a distance equal to about $N.(xp/2)$, where N is a positive integer and $xp=h/(4.m.\alpha)$, where h is Plank's constant, m is the effective mass of the charge carrier and $\alpha$ is Rashba coupling constant.

10. A device according to claim 1, wherein the at least one lead comprises:
    first and second leads connected to the channel and arranged on opposite sides of the channel for measuring a voltage difference across the channel.

11. A device according to claim 10, wherein the at least one lead further comprises:
    third and fourth leads connected to the channel and arranged on opposite sides of the channel for measuring a voltage difference across the channel, said third and fourth leads being spaced apart along the channel from the first and second leads.

12. A device according to claim 1, wherein the semiconducting material of opposite conductivity type to the channel is non-ferromagnetic.

13. A method of operating a device comprising a channel for charge carriers comprising non-ferromagnetic semiconducting material in which charge carriers exhibit spin-orbit coupling, a region of semiconducting material of opposite conductivity type to the channel and configured so as to form a junction with the channel for injecting spin-polarised charge carriers into an end of the channel and at least one lead connected to the channel for measuring a transverse voltage across the channel, the method comprising:
    illuminating the junction with light; and
    measuring bias(es) at the lead(s).

14. A method according to claim 13, further comprising:
    applying a reverse bias between the region and another end of the channel.

15. A method of fabricating a device, the method comprising:
    providing a channel for charge carriers comprising non-ferromagnetic semiconducting material in which charge carriers exhibit spin-orbit coupling,
    providing a region of semiconducting material of opposite conductivity type to the channel and configured so as to form a junction with the channel for injecting spin-polarised charge carriers into an end of the channel and
    providing at least one lead connected to the channel for measuring a transverse voltage across the channel.

16. A method according to claim 15, the method comprising:
    providing a layer structure comprising first and second overlying channels; and
    etching a portion of one of the channels so as to leave the region and the channel.

17. A device according to claim 1, wherein the junction is configured to receive and absorb light and, in response thereto, to generate the spin-polarised charge carriers.

18. Apparatus comprising:
    a device according to claim 1; and
    a source of circularly-polarized light configured to illuminate the junction.

19. A device according to claim 1, wherein regions proximate to the channel comprise non-ferromagnetic material(s) such that the regions do not apply an external magnetic field on the channel.

20. A device according to claim 7, wherein the gate comprises a non-ferromagnetic material.

21. A device according to claim 1, wherein the non-ferromagnetic semiconducting material comprises a direct bandgap semiconductor.

22. A device according to claim 5, wherein the III-V semiconducting material comprises a GaAs semiconductor.

23. A device according to claim 1, wherein the non-ferromagnetic semiconductor material comprises a II-VI semiconductor.

24. A device according to claim 1, wherein the at least one lead comprises only one lead.

25. A device according to claim 1, wherein the at least one lead comprises only leads along one side of the channel.

* * * * *